United States Patent
Soto (10) Patent No.: US 7,296,963 B2
(45) Date of Patent: Nov. 20, 2007

(54) MULTI-ROW PASSIVE COMPONENT CARRIER TAPE

(75) Inventor: Juan P. Soto, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 200 days.

(21) Appl. No.: 10/215,119

(22) Filed: Aug. 8, 2002

(65) Prior Publication Data

US 2004/0025335 A1 Feb. 12, 2004

(51) Int. Cl.
*B65G 65/38* (2006.01)
*B65B 69/00* (2006.01)
*B32B 38/10* (2006.01)

(52) U.S. Cl. ............ 414/811; 414/416.03; 414/416.05; 414/416.08; 156/344; 156/584; 221/79; 221/87

(58) Field of Classification Search .................. 221/25, 221/72, 73, 79, 87; 414/411, 416, 425, 416.01, 414/416.03, 416.05, 416.08, 811; 156/344, 156/584; 226/120, 139
See application file for complete search history.

(56) References Cited

U.S. PATENT DOCUMENTS

| | | | | |
|---|---|---|---|---|
| 4,610,083 A | * | 9/1986 | Campisi et al. ............... | 29/832 |
| 5,213,653 A | * | 5/1993 | Akahori et al. ............. | 156/584 |
| 5,299,902 A | * | 4/1994 | Fujiwara et al. ........ | 414/416.01 |
| 5,598,986 A | * | 2/1997 | Ando et al. .............. | 242/597.6 |
| 6,705,376 B2 | * | 3/2004 | Van Der Rijst ............. | 156/584 |

FOREIGN PATENT DOCUMENTS

| | | | |
|---|---|---|---|
| JP | 2-241099 | * | 9/1990 |
| JP | 6-56166 | * | 3/1994 |
| JP | 09323782 A | * | 12/1997 |
| JP | 11035066 A | * | 2/1999 |
| JP | 11236090 A | * | 8/1999 |
| JP | 11236091 A | * | 8/1999 |
| JP | 11310294 A | * | 11/1999 |
| JP | 2000085879 A | * | 3/2000 |
| JP | 2001-203496 | * | 7/2001 |
| JP | 2003285867 A | * | 10/2003 |

* cited by examiner

*Primary Examiner*—Mark A. Osele
(74) *Attorney, Agent, or Firm*—Schwegman, Lundberg & Woessner, P.A.

(57) ABSTRACT

A carrier tape for a tape and reel machine includes at least one edge having a plurality of sprocket openings therein. The carrier tape also includes a first row of aperture cavities and a second row of aperture cavities. Electrical components are contained in the first and second row of aperture cavities. In some embodiments, the electrical components carried are the same, and in other embodiments, the electrical components carried in the first row differ from the electrical components carried in the second row.

14 Claims, 5 Drawing Sheets

MULTI-ROW PASSIVE COMPONENT CARRIER TAPE

FIELD OF THE INVENTION

The present invention pertains to a method and apparatus for transporting or handling electrical components in electronic manufacturing process. Specifically, the present invention is related to tape structures and methods for using the same that increase the efficiency of electronic manufacturing processes efficiency.

BACKGROUND OF THE INVENTION

One system or method of manufacturing electrical products that have electrical components is to use a tape and reels process. The carrier tape used in current tape and reel processes has a single row of apertures. Each aperture houses an electrical component. The carrier tape also has sprocket openings on each edge of the tapes. Sprockets associated with a feeder mechanism move the carrier tape to an index position where the tape presents the electrical component to a pick and place mechanism. The pick and place mechanism removes or picks the electrical component from the tape and places it on the electrical product so that it can be connected or soldered into place.

Tape and reel systems have shortcomings. Among the shortcomings is that only one electrical component is presented to the pick and place mechanism after the feeder mechanism indexes the carrier tape. The current one row carrier tape solution is inefficient since only one electrical component is available for the pick and place process at each indexed position.

Thus, there is need for a more efficient tape and reel system that will make the electronic manufacturing process more efficient. There is also a need for a tape and reel system that will allow for faster and less costly production.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
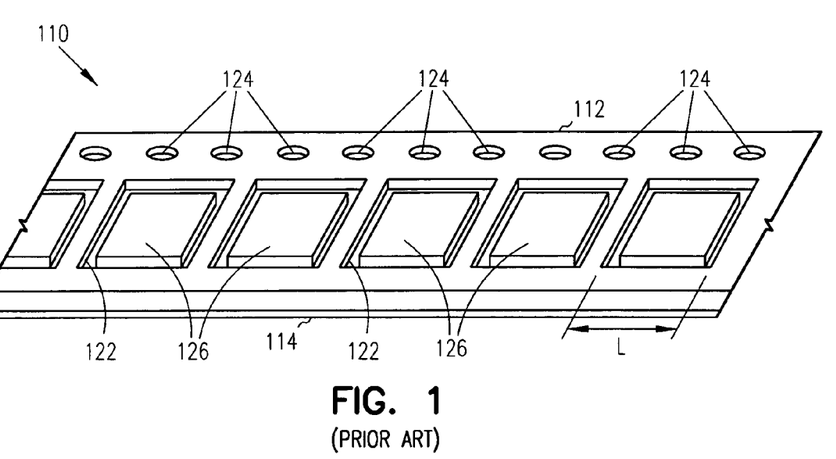
FIG. 1 illustrates a perspective view of a carrier tape of the prior art.
Figure 2:
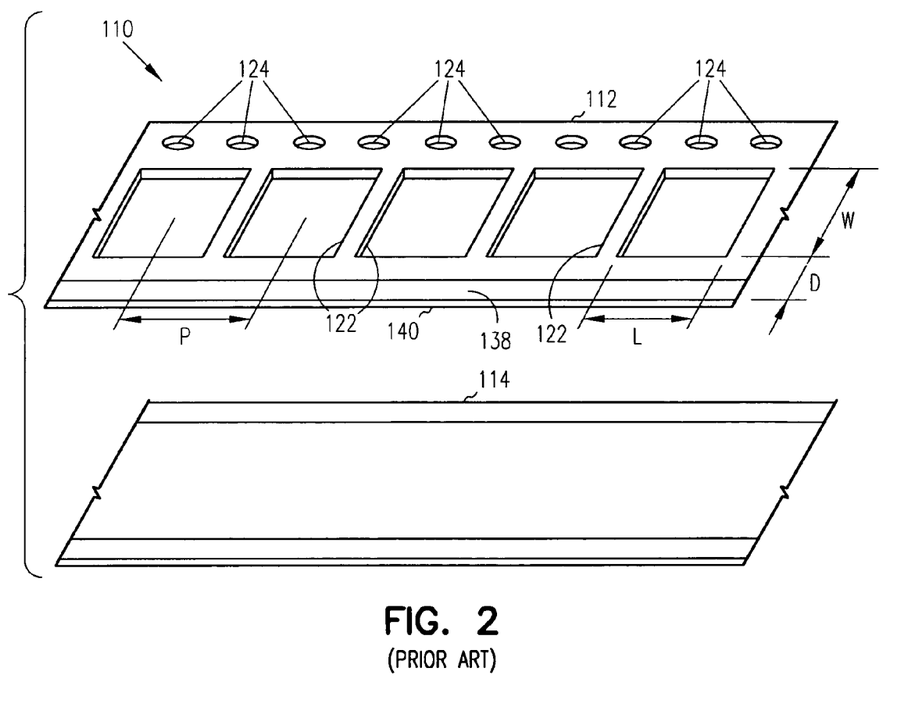
FIG. 2 illustrates an exploded perspective view of a carrier tape of the prior art.

FIG. 1 illustrates a perspective view of a prior art longitudinal carrier tape 110 which has small components or dies 126 fitted into a plurality of aperture cavities 122. The longitudinal carrier tape 110 has a single row of components 126. The longitudinal carrier tape 110 also includes a row of sprocket openings or sprocket drive holes 124 which are used to move the tape between index positions. FIG. 2 illustrates an exploded perspective view of the prior art carrier tape 110 which includes a longitudinal punched tape 112 and a longitudinal backing tape 114.

Referring to FIGS. 1 and 2, the longitudinal punched tape 112 is a smooth ribbon-like film, usually made of plastic or paper. The punched tape 112 has a front side 138, a back side 140 and a plurality of aperture cavities 122 which have a volume region. The punched tape 112 thickness is the same as the thickness "D" of the aperture cavity 122. The length "L", width "W" and thickness "D" of an individual aperture cavity 122 is generally dependent on the pitch "P" of the aperture cavities 122 to the sprocket drive holes 124 as well as the nature and thickness of the component to be placed within the aperture cavity 122. As one example, the volume region of the aperture cavities 122 on a 2 mm pitch "P" can have dimensions approximately sixty (60) mils in length, by one hundred twenty-five (125) mils in width, by ten (10) mils in depth to contain components 126 as small as eight (8) to ten (10) mils square by five (5) to six (6) mils thick, in addition to larger components 126 ranging up to approximately 90% of the aperture cavity volume. Some of the normal ranges for the punched tape 112 thickness "D" and resulting aperture cavity depth is of the order of five (5) or six (6) mils at a shallow depth, and sixty (60) or seventy (70) mils for the thicker cavity material. The thickness "D" of the punched tape 112 may be greater than the thickness of the small component 126 which is to be retained, or thickness "D" of the punched tape 112 may be substantially less than the thickness of the component 126 to be retained, thereby allowing the retained component 126 to protrude above the surface of punched tape 112, for certain automated handling and processing needs. The punched tape 112 can be made of plastic material.

The punched tape 112 can be used in high speed manufacturing processes, where a continuous reel of small components 126 are retained in the aperture cavities 122 and are sequentially indexed to a specific position or dead spot by the processing machinery. In order to feed the punched tape 112 forward, accurately indexing the punched tape 112 forward an exact distance, the punched tape 112 has sprocket drive holes 124 which engage gear teeth of a drive wheel or the probe of a lateral pawl of the processing machinery (typically, a tape feeder) and synchronizes the translation of the punched tape 112 with the action of other processing machinery such as the vacuum tip arm of a pick-and-place assembly system. The direction of forward feed is designated by an arrow "F" which the punched tape 112 moves during final assembly placement of the components 126 contained therein.

The longitudinal spacing between the longitudinal centerlines of one aperture cavity 122 to an adjacent aperture cavity 122 is shown as the pitch "P". The pitch "P" is set to adapt to the action of a carrier tape transport mechanism, typically a tape feeder used with a pick-and-place assembly system, and is governed by the "L" and "W" dimensions of the aperture cavity required to suitably contain the component therein.

Figure 3:
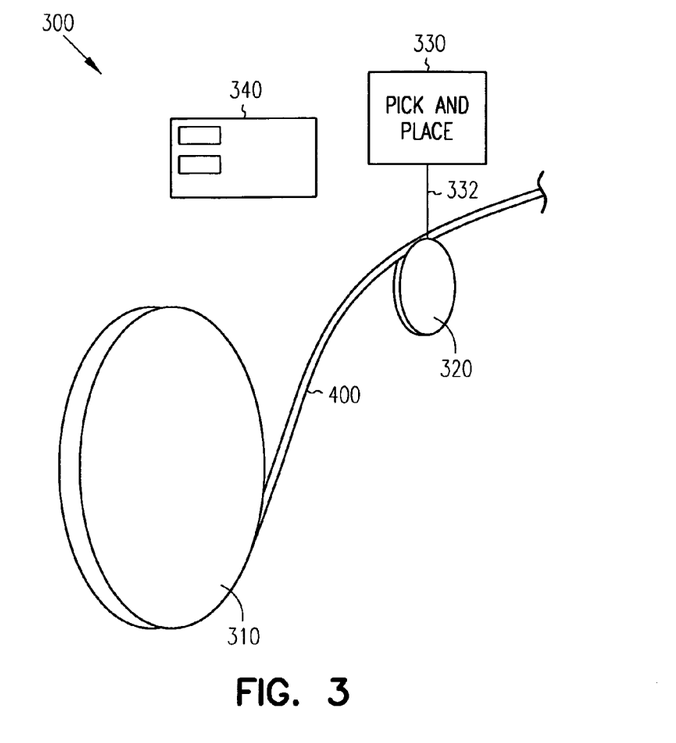
FIG. 3 illustrates a schematic view of a tape automated bonding machine.

FIG. 3 illustrates a schematic view of a tape and reel machine 300. The tape and reel machine includes a reel 310 that carries a carrier tape 400 having electrical components therein. A sprocket 320 moves the carrier tape 400 to successive index positions where a pick and place machine 330 removes electrical components from an aperture in the carrier tape 400 using a vacuum pickup 332 and places the electrical components on the electrical product, such as a circuit board 340 shown.

Described in FIGS. 4-8 are the various carrier tapes used in the tape and reel machine 300. Each carrier tape represents one of several embodiments of the present invention. Each carrier tape includes a cover tape that is removed by the tape and reel machine 300 before the electrical component on the carrier tape is picked by the tape and reel machine 300. The cover tape is typically made of a thin, transparent material such as plastic. The cover tape holds the electrical component within the aperture of the carrier tape. For the sake of clarity, the cover tape is not shown on each of the carrier tapes shown in FIGS. 4-8. It should be understood that these carrier tapes 400, 500, 600, 700, 800 shown in FIGS. 4-8 generally include a cover tape for containing individual electronic components within apertures in the carrier tape.

Figure 4:
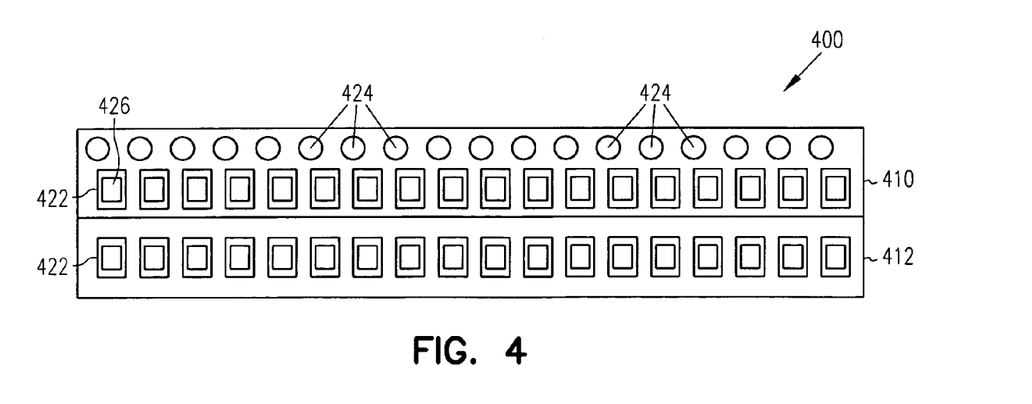
FIG. 4 illustrates one embodiment of the carrier tape of the instant invention.

FIG. 4 illustrates one embodiment of a carrier tape 400 of the instant invention. The carrier tape 400 is a longitudinal punched tape in the form of a smooth, ribbon-like film, usually made of paper or plastic. The carrier tape 400 includes a plurality of aperture cavities 422 which have a specific volume. The aperture cavities occur in a first row 410 and in a second row 412. The aperture cavities 422 hold electronic components 426. The length "L", width "W" and thickness "D" of an individual aperture cavity 422 is generally dependant upon the nature and thickness of the component to be placed within the aperture cavity 422, as well as the pitch between the aperture cavities 422 and the sprocket drive holes 424. The carrier tape 400 can be used in high speed manufacturing processes or other electronic manufacturing processes where a continuous reel of small components 426 are retained in the aperture cavities 422 and are sequentially indexed to a specific position or dead spot by the processing machinery. Specifically, the feeder mechanism of the tape and reel machine 300 moves the tape 400 using the sprocket openings 424 between the index positions. The feeder mechanism removes the covering on the tape (not shown) to expose the electrical components 426 within the apertures 422 to a pick and place machine 330 (shown in FIG. 3).

The advantage of using tape 400 is that at each index position two rows of components are presented to the pick and place machine or the pick and place assembly system. Therefore, pick and place efficiency is increased by having multiple electrical components 426 available to pick and place at the same time without increasing the amount of feeders into the tape automated bonding machine 300. Cost is reduced by reducing the number of reels or tape and reel machines 300 required to deliver the same number of components to an indexed position where the components 426 are picked from the carrier tape 400. Thus, at each index position there are at least double the number of electrical components 426 presented to the pick and place assembly of the tape and reel machine 300. It should be noted that pick and place assembly require parts to be available in the same position at each index point, yet they do not require that one part be in the same position at each index point. In other words, a pick and place machine 330 can manage having two parts in different positions as long as the same two positions are consistent each and every time the tape 400 is indexed or the small electrical components 426 within the aperture openings 422 are presented to the tape and reel machine 300. The efficiency is also increased since the feeder mechanism does not have to index the tape 400 for each electronic component 426. In other words, the pick and place machine indexes the tape 400 to a position to expose several of the aperture openings 422 and the electrical components 426 within those aperture openings. The pick and place machine 330 removes the parts without having to re-index the tape for each and every port. This also increases the efficiency of the tape and reel machine 300 as well as the efficiency of the electronic manufacturing process.

Figure 5:
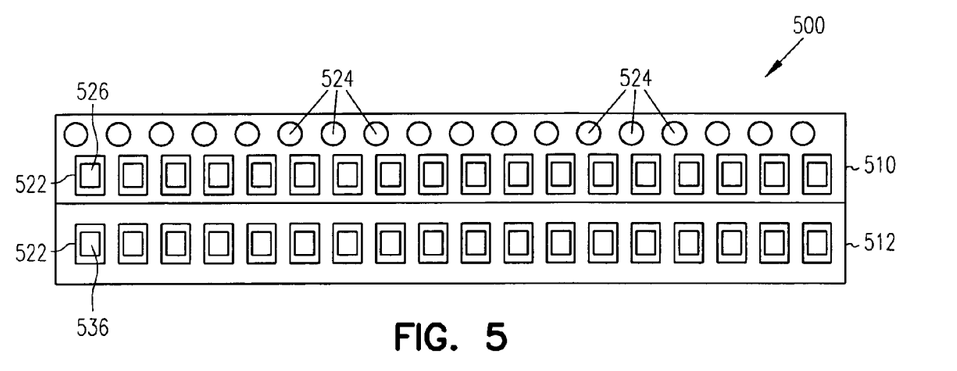
FIG. 5 illustrates another embodiment of the carrier tape of the instant invention.

FIG. 5 illustrates another embodiment of a carrier tape 500 of the instant invention. Carrier tape 500 is very similar to the carrier tape 400. The carrier tape 500 is a smooth, ribbon-like film, usually made of paper or plastic. The longitudinal carrier tape 500 includes sprocket drive holes or sprocket openings 524 along one edge of the tape 500. The carrier tape 500 has a thickness "D". The carrier tape includes aperture openings 522, which occur in a first row 510 and in a second 512. The aperture cavities or openings 522 have a thickness "D", a length "L", and a width "W". The actual length, width and thickness of an individual aperture cavity 522 is generally dependant upon the pitch of the aperture cavities 522 to the sprocket drive holes or openings 524 as well as the nature and thickness of the electrical component, which will be carried by the aperture cavity or opening 522. The difference between tape 500 and tape 400 is that the aperture openings 522 of row 510 carry a first type of electrical component 526, while the aperture openings or cavities 522 found in row 512 carry a second type of electrical component 536. During electronic manufacturing processes, the carrier tape 500 can be used to deliver two types of electrical components 526 and 536 to the tape and reel machine 300 (as shown in FIG. 3). Thus, each time the tape is indexed to a specific position or dead spot by the feeder system of the tape and reel machine 300, at least one of the first type of electrical component 526 and one of the second type of electrical component 536 are presented to the pick and place machine 330 of the tape and reel machine 300. Of course, the apertures 522 one covered by a cover tape (not shown) which is removed just prior to picking and placing the component 526, 536. This multi-row solution provides for increased pick and place efficiency since multiple components are available to the pick and place machine 330 (as shown in FIG. 3) for each indexed position. In addition, there is no need to have an additional feeder and an additional sprocket 320 (as shown in FIG. 3) to handle an additional tape. Cost is reduced by reducing the number of reels required to deliver the same amount of components to the tape and reel machine 300. Thus, the tape 500 provides for a much more efficient tape and reel machine 300 and for a much more efficient electric manufacturing process.

Figure 6:
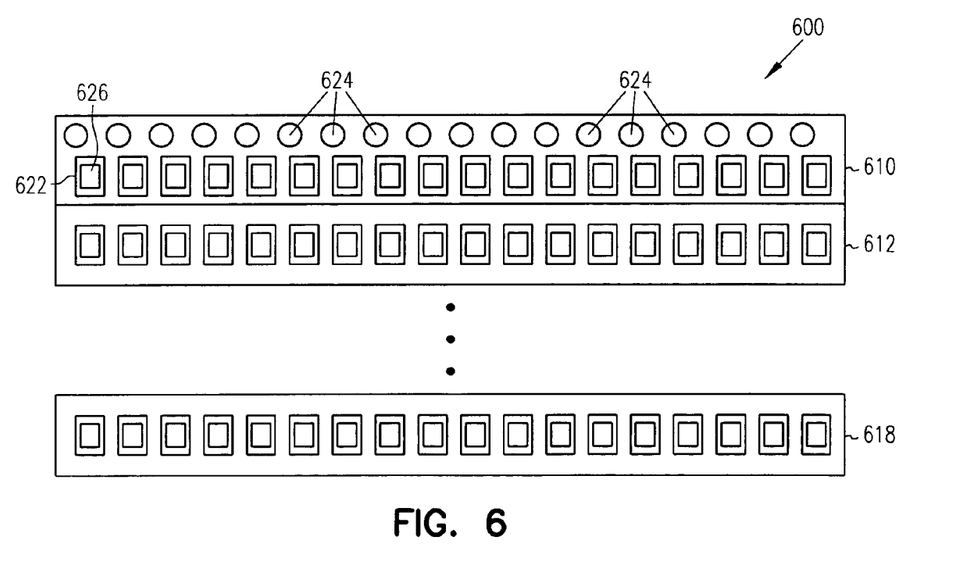
FIG. 6 illustrates another embodiment of the carrier tape of the instant invention.

FIG. 6 illustrates another embodiment of a carrier tape 600 of the instant invention. The carrier tape 600 includes a first edge and a second edge. The first edge includes sprocket drive openings or holes 624. The carrier tape 600 also includes a number of individual aperture cavities 622 having a length "L", width "W" and thickness "D", which is generally dependant upon the pitch of the aperture cavity 622 to the sprocket drive holes or openings 624, as well as the nature and thickness of electrical components 626, which are carried in the aperture cavities 622. The aperture cavities 622 are situated in a number of rows 610, 612 and 618. In fact, the carrier tape 600 extends the idea of having rows of apertures 622 carrying rows of electrical components 626 to any number of rows, N, as depicted by the dots between row 612 and row 618 of the carrier tape 600. It should be noted that the electrical components carried within each row 610, 612, 618 may be the same electrical component or same type of electrical component, or the electrical components within the various rows can all be different.

The advantages presented by the carrier tape 600 are similar or the same to those discussed with respect to carrier tapes 400 and 500. Namely, the advantages are that during production, the carrier tape 600 can be used or indexed to a position so that the pick and place machine 330 (as shown in FIG. 3) is able to pick and place more than one component each time the tape 600 is indexed to a dead spot or index position. This multi-row solution increases the pick and place efficiency since the pick and place device or pick and place machine 330 (as shown in FIG. 3) of the tape and reel machine 300 does not wait for the tape 600 to index each time a component is needed to be placed on an electrical product 340 (as shown in FIG. 3). In addition, the number of carrier tapes that need to be fed into the machine are reduced, as well as reducing the number and amount of feeders into the tape and reel machine 300 (as shown in FIG. 3).

Figure 7:
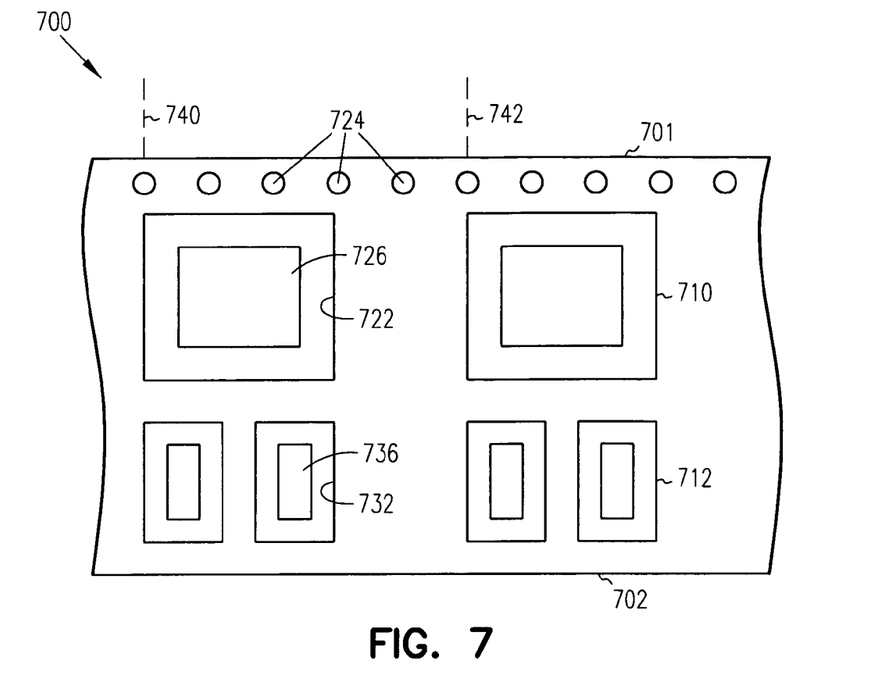
FIG. 7 illustrates yet another embodiment of the carrier tape of the instant invention.

FIG. 7 illustrates yet another embodiment of a carrier tape 700 of the instant invention. In this particular embodiment, the tape has a first edge 701 and a second edge 702. The first edge 701 includes a plurality of sprocket drive openings 724. The tape also includes aperture openings 722 and aperture openings 732. The aperture openings 722 carry and contain electrical components 726. Aperture openings 732 carry electrical component 736. Electrical components 726 are different than the electrical components 736. As shown in this particular example, there are two apertures 732 for each of the apertures 722 and, therefore, there are two electrical components 736 presented for each of the electrical components 726. The aperture 722 occurs in a row 710 closest to the first edge 701, and the aperture 732 occurs in a row 712 closest to the edge 702 of the carrier tape 700. A number of the sprocket openings 724 are counted to come to an index position. The index position is a position where an aperture cavity or opening 722 and two aperture openings or cavities 732 are presented to the pick and place machine 330 (as shown in FIG. 3) of the tape automated bonding machine 300 (as shown in FIG. 3). The index position is shown to be a position between the dotted lines 740 and 742 of FIG. 7. Thus, at each of the index positions that are successively moved to upon with the carrier tape 700 an electrical component 726 is removed from the first row 710 while two electrical components 736 are removed from the second row 712. It should be noted that the two components 736 may be the same or they may be different at each indexed position.

In this particular embodiment, it should be noted that at each of the indexed positions, each of the electrical components 726 and 736 are repeatedly placed in the same X, Y, and Z position for the pick and place machine 330 (shown in FIG. 3). In other words, the same positioning is repeated each time the carrier tape 700 is indexed to a new index position.

The advantages of this particular tape are that the tape 700 can be provided with specific components necessary to build a particular electrical product such as populating a particular circuit board 340 (as shown in FIG. 3). Advantageously, the efficiency of the pick and place process is increased since additional feeder tapes or additional tapes do not have to be fed into the tape automated bonding machine. In addition, the pick and place machine or assembly 330 (as shown in FIG. 3) does not have to wait for each and every component to be indexed on a separate carrier tape in order to pick the particular component from the carrier tape. In other words, in this particular embodiment three components can be picked and placed per indexed position before the pick and place machine 330 (as shown in FIG. 3) will have to wait for the carrier tape 700 to be re-indexed. Of course, it should be noted that this particular idea can be further extended to include more rows beyond those rows 710 and 712 shown in FIG. 7.

Figure 8:
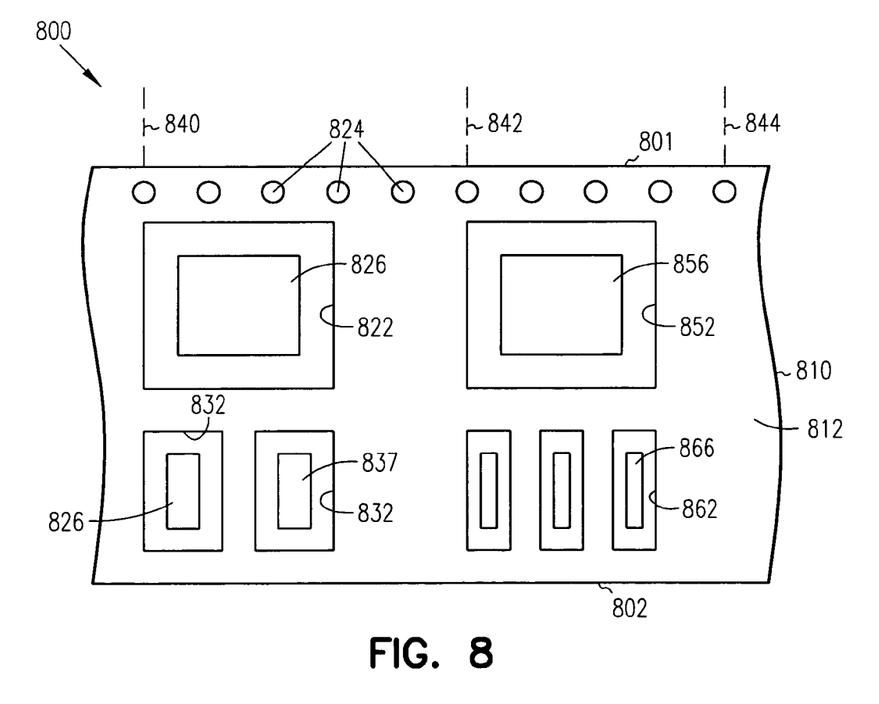
FIG. 8 illustrates yet another embodiment of the carrier tape of the instant invention.

FIG. 8 illustrates yet another embodiment of a carrier tape 800 of the instant invention. The carrier tape 800 includes a first edge 801 and a second edge 802. Along the first edge there are sprocket drive openings or holes 824. Sprocket drive openings 824 are used to move the tape 800 to various index positions. One index position is shown between the lines 840 and 842, and another index position is shown between lines 842 and 844. The carrier tape 800 includes aperture cavities or openings 822 and 852, which occur in a first row 810. The carrier tape also includes aperture openings 832 and 862, which occur in a second row 812. The aperture opening 822 carries an electrical component 826, while the aperture opening 852 carries an electrical component 856. The aperture openings 832 carry two different types of electrical components 836 and 837. Each of the aperture openings 862 carries an electrical component 866. As shown in FIG. 8, at the indexed position between lines 840 and 842, there is one aperture opening 822 for two aperture openings 832 so that at the index position between the lines 840 and 842, an electrical component 826 will be presented in aperture opening 822, and an electrical component 836 will be presented in aperture opening 832, and a different electrical component will be presented in the other occurrence of the aperture opening 832 between the dotted lines 840 and 842. Upon re-indexing the tape, the aperture opening 852 and aperture openings 862 will be presented. As shown in FIG. 8, there is one aperture opening 852 and three instances of the aperture opening 862. Thus, one electrical component 856 is presented while three electrical components 866 are presented in each of the aperture openings 862. The second index position is between the lines 842 and 844. Thus, the idea here is that for each index position the same electrical components need not be delivered. Of course, there will need to be a repeating pattern of the electrical component for a given number of index positions along the tape 800. For example, as shown in FIG. 8, this pattern of two index positions with different components would be repeated over and over so that the pick and place machine 330 (shown in FIG. 3) can be programmed so that at a first index position the pick and place machine accesses the electrical components 826, 836, and 837, and at a second index position the pick and place machine 330 (shown in FIG. 3) accesses electrical components 856 and the three electrical components 866. The benefits of this are numerous. The number of feeder tapes that need to be put into a pick and place machine 330 (shown in FIG. 3) can be further reduced. The tapes can be custom made to populate or produce particular electrical products 340 (as shown in FIG. 3). The number of rows can be extended also beyond rows 810 and 812 as shown in FIG. 8, which further increases the pick and place efficiency since the pick and place machine will be able to do the pick and placing without having to wait for re-indexing of the tape.

Figure 9:
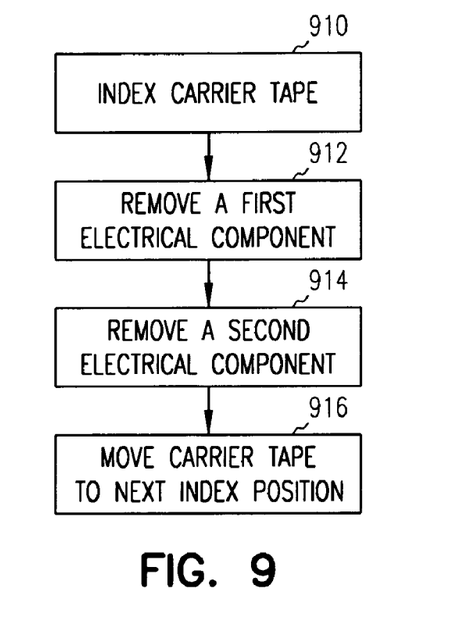
FIG. 9 illustrates a method for assembly of an electrical product using a pick and place machine.

FIG. 9 illustrates a method for assembling an electrical product using a pick and place machine and using the tapes for 400, 500, 600, 700 and 800 of the instant invention. The initial step is to index the carrier tape, as depicted by reference numeral 910. Once the carrier tape is in an index position, the pick and place machine removes the first electrical component from the carrier tape and places it on to an electrical product, as depicted by reference numeral 912. The next step is to remove a second electrical component from the carrier tape while in the same index position, as depicted by reference numeral 914. Of course, part of removing the first and second electrical components includes removing the cover tape covering the apertures of the carrier tape. The pick and place machine will then place the second electrical component onto the electrical product while the carrier tape is moved to the next index position, as depicted by reference numeral 916.

Figure 10:
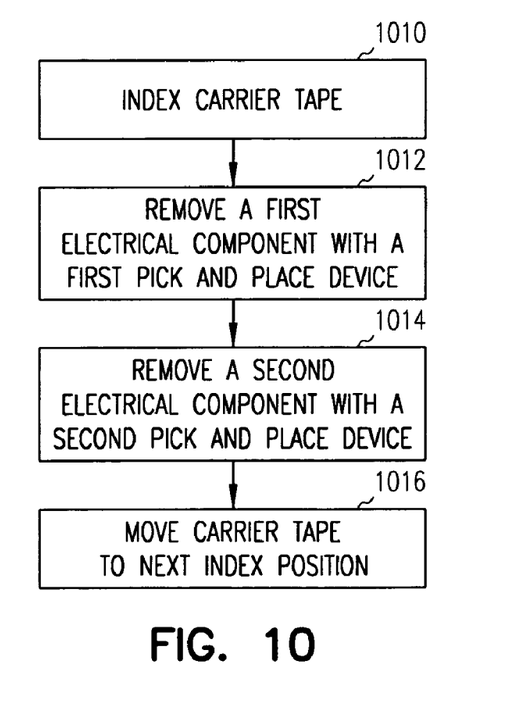
FIG. 10 illustrates another method for assembly of an electrical product using at least two pick and place machines.

FIG. 10 illustrates yet another embodiment for assembly of an electrical product using at least two pick and place machines. The first step is to index the carrier tape, as depicted by reference numeral 1010. The next step is to remove a first electrical component from the carrier tape using a first pick and place device as depicted by reference numeral 1012. The next step is to remove a second electrical component with a second pick and place device, as depicted by reference numeral 1014. Of course, part of removing the first and second electrical components includes removing the cover tape covering the apertures of the carrier tape. Finally, the carrier tape is moved to the next index position, as depicted by reference numeral 1016.

It should be noted that one carrier tape could be used to feed two pick and place machines and to build two electrical products. For example, two circuit boards could be built substantially simultaneously from the same tape. A further extension of this invention is that a single carrier tape could be provided with many of the components needed for a particular electrical product or a particular circuit board. The first pick and place machine could populate one side of the circuit board, and the second pick and place machine could populate a second side or area of the circuit board so that the pick and place machines would not interfere with one another during the manufacturing process.

The structures shown and described in the above figures and the methods discussed for making these structures provides many advantages. Using the inventive carrier tapes and methods described, tape and reel machines and the associated processes provide for a more efficient electronic manufacturing systems. The carrier tapes present more than one electrical component to the pick and place machine when the carrier tape stops at a particular index point. This makes the tape and reel machine is made more efficient at delivering electrical components and allows for faster and less costly production.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for assembling a device including electrical components comprising:
    moving a carrier tape to a first index position;
    removing a first electrical component from a first aperture cavity of the carrier tape while the carrier tape is in the first index position;
    removing a second electrical component from a second aperture cavity of the carrier tape while the carrier tape is in the first index position, wherein the second electrical component differs from the first electrical component;
    removing a third electrical component from a third aperture cavity of the carrier tape while the carrier tape is in the first index position, wherein at least two of the first, second or third electrical component is different from the other of the first, second or third electrical components, and the at least two of the first, second or third components are housed in two adjacent openings adjacent to a side of the other opening and along a length of the carrier tape that is substantially equal to the length of the opening of the other component; and
    moving the carrier tape to a second index position.

2. The method of claim 1, wherein the first electrical component and the second electrical component are similarly sized.

3. The method of claim 1, wherein the first aperture and the second aperture are different.

4. The method of claim 1, wherein removing the first electrical component includes removing the first electrical component with a pick and place machine.

5. The method of claim 4, wherein removing the second electrical component includes removing the second electrical component with a pick and place machine.

6. The method of claim 1, wherein removing the first electrical component includes removing the first electrical component with a first pick and place machine, and wherein removing the second electrical component includes removing the second electrical component with a second pick and place machine.

7. The method of claim 1, further comprising removing a fourth electrical component at the second index position.

8. The method of claim 7, wherein the third electrical component differs from at least one of the first electrical component and the second electrical component.

9. The method of claim 1, wherein removing a first electrical component from a first aperture cavity of the carrier tape and removing a second electrical component from a second aperture cavity of the carrier tape includes moving a pick and place machine transverse to the carrier tape.

10. The method of claim 1, wherein removing a first electrical component from a first aperture cavity of the carrier tape and removing a second electrical component from a second aperture cavity of the carrier tape includes moving a pick and place machine along the length of the carrier tape.

11. The method of claim 1, wherein removing the first electrical component, the second electrical component, and the third electrical component from the carrier tape includes moving a pick and place machine along the length of the carrier tape and transverse to the carrier tape.

12. A method for assembling a device comprising: moving a carrier tape to a first index position;
removing a first component from a first aperture cavity of the carrier tape while the carrier tape is in the first index position;
removing a second electrical component from a second aperture cavity of the carrier tape while the carrier tape is in the first index position, wherein the second electrical component differs from the first electrical component;
removing a third component from a third aperture cavity of the carrier tape while the carrier tape is in the first index position, wherein the second and third apertures are adjacent one another and are positioned adjacent a side of the first aperture along a length of the carrier tape substantially equal to the length of the first aperture; and
moving the carrier tape to a second index position.

13. The method of claim 12, wherein the first aperture cavity and the second aperture cavity are different sizes.

14. A method for assembling a device including electrical components comprising:
moving a carrier tape to a first index position;
removing a first electrical component from the carrier tape while the carrier tape is in a first index position; and
removing a second electrical component from a second aperture cavity of the carrier tape while the carrier tape is in the first index position, wherein the second electrical component differs from the first electrical component; and
removing a third electrical component from a third aperture cavity of the carrier tape while the carrier tape is in the first index position, wherein the second and third apertures are adjacent one another and are positioned adjacent to a side of the first aperture, the side of the first aperture along a length of the carrier tape substantially equal to the length of the carrier tape of the first aperture.

* * * * *